United States Patent
Du

(10) Patent No.: US 9,519,192 B2
(45) Date of Patent: Dec. 13, 2016

(54) ARRAY SUBSTRATE, FLAT DISPLAY PANEL AND MANUFACTURING METHOD FOR THE SAME

(71) Applicant: Shenzhen China Star Optoelectronics Technology Co., Ltd., Shenzhen, Guangdong (CN)

(72) Inventor: Peng Du, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/647,803

(22) PCT Filed: Apr. 16, 2015

(86) PCT No.: PCT/CN2015/076727
§ 371 (c)(1),
(2) Date: May 27, 2015

(87) PCT Pub. No.: WO2016/155041
PCT Pub. Date: Oct. 6, 2016

(65) Prior Publication Data
US 2016/0291418 A1 Oct. 6, 2016

(30) Foreign Application Priority Data
Mar. 31, 2015 (CN) .......................... 2015 1 0148758

(51) Int. Cl.
*G02F 1/1335* (2006.01)
*G02F 1/1343* (2006.01)
(Continued)

(52) U.S. Cl.
CPC ... *G02F 1/134309* (2013.01); *G02F 1/133345* (2013.01); *G02F 1/133514* (2013.01);
(Continued)

(58) Field of Classification Search
CPC .......................................... G02F 2001/134372
See application file for complete search history.

(56) References Cited

U.S. PATENT DOCUMENTS 6,373,541 B1 * 4/2002 Sekime ................. G02F 1/1396
349/113
7,075,602 B2 * 7/2006 Sugiura ................. G02F 1/1393
349/113

(Continued)

*Primary Examiner* — Phu Vu
(74) *Attorney, Agent, or Firm* — Andrew C. Cheng

(57) ABSTRACT

The present invention provides an array substrate, a flat display panel and a manufacturing for the same. The array substrate includes a substrate, a common electrode disposed on the substrate, an insulation layer disposed on the common electrode, wherein, the insulation layer includes multiple first regions and multiple second regions, and the first regions and the second regions are disposed alternately, and multiple pixel electrodes respectively disposed on the first regions of the insulation layer. Wherein, a thickness of the first regions and a thickness of the second regions are different. Through above way, the electric field strength between pixel electrodes and the electric field strength above the pixel electrodes can be adjusted in order to increase the display quality of the flat display panel.

10 Claims, 2 Drawing Sheets

(51) Int. Cl.
*G02F 1/1333* (2006.01)
*H01L 27/12* (2006.01)
(52) U.S. Cl.
CPC ............... *H01L 27/1288* (2013.01); *G02F 2001/134372* (2013.01)

(56) References Cited

U.S. PATENT DOCUMENTS

2003/0160918 A1* 8/2003 Rho .................. G02F 1/133555
349/113
2011/0013121 A1* 1/2011 Kashima ................ G02B 5/201
349/86

* cited by examiner

ARRAY SUBSTRATE, FLAT DISPLAY PANEL AND MANUFACTURING METHOD FOR THE SAME

BACKGROUND OF THE INVENTION

1. Field of the Invention

The present invention relates to the liquid crystal display technology, and more particularly to an array substrate, a flat display panel and manufacturing method for the same.

2. Description of Related Art

As shown in FIG. 1, an array substrate having a fringe-field switching (FFS) mode includes: a substrate 1, a common electrode 2 disposed on the substrate, an insulation layer 3 disposed on the common electrode 2 and multiple pixel electrodes 4 disposed on the insulation layer 3 at intervals. From FIG. 1, in the conventional art of the array substrate, an electric field strength between pixel electrodes and an electric field strength above the pixel electrode are different.

When the array substrate is applied in a flat display panel, because the electric field strength above the pixel electrode and an electric field strength between pixel electrodes are different, an alternate bright and dark situation is generated at a portion above the pixel electrode and a portion between pixel electrodes. A water ripple phenomenon is generated at a flat display panel so as to directly affect the display quality of the flat display panel.

SUMMARY OF THE INVENTION

The main technology problem solved by the present invention is to provide an array substrate, a flat display panel and a manufacturing for the same. Through the present invention, the electric field strength between pixel electrodes and the electric field strength above the pixel electrodes can be adjusted in order to increase the display quality of the flat display panel.

In order to solve the above technology problem, a technology solution adopted by the present invention is: an array substrate, comprising: a substrate; a common electrode disposed on the substrate; an insulation layer disposed on the common electrode, wherein, the insulation layer includes multiple first regions and multiple second regions, and the first regions and the second regions are disposed alternately; and multiple pixel electrodes respectively disposed on the first regions of the insulation layer; wherein, a thickness of the first regions and a thickness of the second regions are different, and the thickness of the first regions is greater than the thickness of the second regions, and the common electrode and the pixel electrodes are made by a transparent and conductive material.

Wherein, a difference of the thickness of the first regions and the thickness of the second regions is set to maintain a difference of an electric field strength between pixel electrodes and an electric field strength above the pixel electrodes in a predetermined range.

Wherein, a difference of the thickness of the first regions and the thickness of the second regions is set to make a difference of an electric field strength between pixel electrodes and an electric field strength above the pixel electrodes be zero.

In order to solve the above technology problem, another technology solution adopted by the present invention is: an array substrate, comprising: a substrate; a common electrode disposed on the substrate; an insulation layer disposed on the common electrode, wherein, the insulation layer includes multiple first regions and multiple second regions, and the first regions and the second regions are disposed alternately; and multiple pixel electrodes respectively disposed on the first regions of the insulation layer; wherein, a thickness of the first regions and a thickness of the second regions are different.

In order to solve the above technology problem, another technology solution adopted by the present invention is: a flat display panel, comprising: a color filter substrate; an array substrate disposed oppositely to the color filter substrate; and a liquid crystal layer disposed between the color filter substrate and the array substrate; wherein, the array substrate includes: a substrate; a common electrode disposed on the substrate; an insulation layer disposed on the common electrode, wherein, the insulation layer includes multiple first regions and multiple second regions, and the first regions and the second regions are disposed alternately; and multiple pixel electrodes respectively disposed on the first regions of the insulation layer; wherein, a thickness of the first regions and a thickness of the second regions are different.

In order to solve the above technology problem, another technology solution adopted by the present invention is: a manufacturing method for an array substrate, comprising: sequentially forming a common electrode, an insulation layer and pixel electrode layer on a substrate; coating a photoresist layer on the pixel electrode layer; exposing and developing the photoresist layer in order to form a patterned photoresist layer; utilizing the patterned photoresist layer and a first etching method to etch the pixel electrode layer in order to form multiple spaced pixel electrodes; and utilizing the patterned photoresist layer and a second etching method to etch the insulation layer such that the insulation layer forms multiple alternate first regions and second regions, wherein, a thickness of the first regions and a thickness of the second regions are different.

Wherein, the first etching method is a wet etching, and the second etching method is a dry etching.

Comparing to the conventional art, the insulation layer of the array substrate includes multiple first regions and multiple second regions, wherein, the first regions and the second regions are disposed alternately. Besides, the thickness of the first regions and the thickness of the second regions are different. Then, multiple pixel electrodes are respectively disposed on the first region of the insulation layer. Because the thickness of the first regions and the thickness of the second regions are different, through adjusting the thickness of the first regions and the thickness of the second regions, the electric field strength between pixel electrodes and the electric field strength above the pixel electrode can be adjusted. according to actual requirement, the difference of the electric field strength between pixel electrodes and the electric field strength above the pixel electrode is maintained in a predetermined range, and even zero such that the brightness between pixel electrodes and the brightness above the pixel electrodes are uniform in order to avoid generating a water ripple phenomenon in a flat display panel so as to increase the display quality and user experience.

DETAILED DESCRIPTION OF THE PREFERRED EMBODIMENT

The following content combines figures and embodiments for detail description of the present invention.

Figure 1:
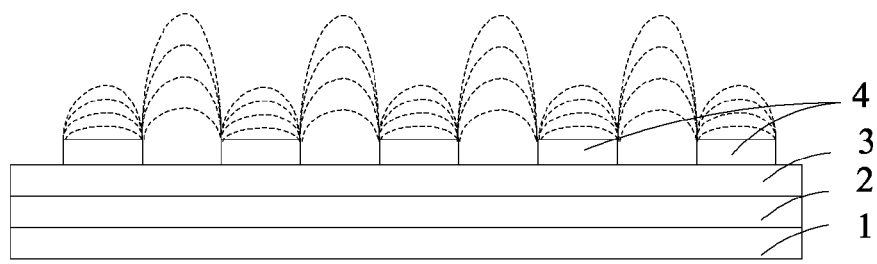
FIG. 1 is an electric field distribution diagram of a conventional array substrate.
Figure 2:
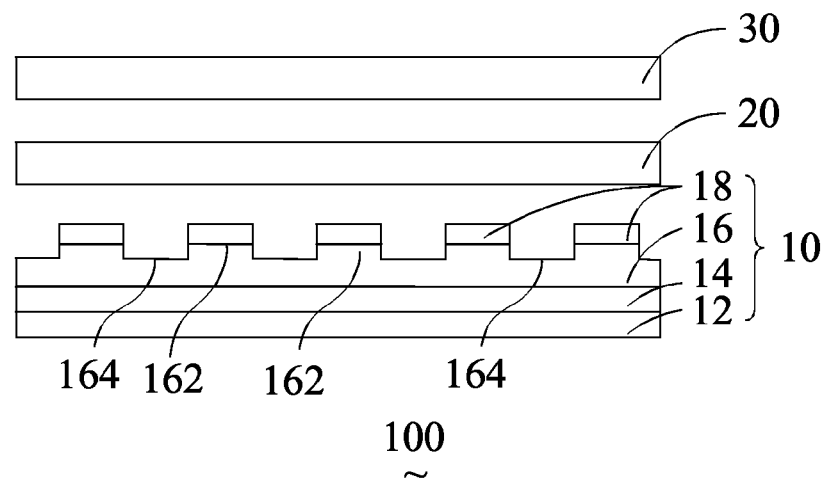
FIG. 2 is a schematic cross-sectional view of a flat display panel according to an embodiment of the present invention.

With reference to FIG. 2, FIG. 2 is a schematic cross-sectional view of a flat display panel according to an embodiment of the present invention. The flat display panel 100 includes an array substrate 10, a color filter substrate 30, and a liquid crystal layer 20 disposed between the array substrate 10 and the color filter substrate 30.

The array substrate 10 includes a substrate 12, a common electrode 14, an insulation layer 16 and multiple pixel electrodes 18.

The substrate 12 is disposed at the lowest layer of the array substrate 10 (using FIG. 2 as a reference).

The common electrode 14 is disposed on the substrate 12. The common electrode 14 can be made by a transparent and conductive material or any other materials used for manufacturing conventional common electrodes such as the metal material, etc.

The insulation layer 16 includes multiple first regions 162 and multiple second regions 164. The first regions 162 and the second regions 164 are disposed alternately. Wherein, a thickness of the first regions 162 and a thickness of the second regions 164 are different. Wherein, the first regions 162 and the second regions 164 can be made by a same material or different materials.

The multiple pixel electrodes 18 are respectively disposed on the first regions 162 of the insulation layer 16 such that the pixel electrodes 18 are disposed on the insulation layer 16 at intervals. The pixel electrodes can be made by a transparent and conductive material or any other materials used for manufacturing the conventional pixel electrodes such as a polysilicon, etc.

The liquid crystal layer 20 is disposed between the color filter substrate 30 and the array substrate 10. The liquid crystal layer 20 is filled with liquid crystal molecules. Wherein, liquid crystal molecules used for filling the conventional flat display panel are all suitable for the present invention. Besides, the materials used for manufacturing the conventional flat display panel are suitable for the color filter substrate 30 of the present invention.

In the present embodiment, the insulation layer 16 on the array substrate 10 includes multiple first regions 162 and multiple second regions 164, wherein, the first regions 162 and the second regions 164 are disposed alternately. Besides, a thickness of the first regions 162 and a thickness of the second regions 164 are different. Furthermore, multiple pixel electrodes 18 are respectively disposed on the first regions of the insulation layer 16. Because thicknesses of the first regions 162 and thicknesses of the second regions 164 are different, an electric field strength between the pixel electrodes and an electric field strength above the pixel electrodes 18 are adjusted in order to increase the display quality of the flat display panel.

Furthermore, a difference of the thickness of the first regions 162 and the thickness of the second region 164 can be set such that a difference of the electric field strength between pixel electrodes 18 and the electric field strength above the pixel electrodes 18 is in a predetermined range.

The predetermined range means that according to an actual requirement, the difference of the electric field strength between pixel electrodes 18 and the electric field strength above the pixel electrodes 18 is in a controllable electric field strength range. In a predetermined range of the electric field strength range, a difference of the thickness of the first regions 162 and the thickness of the second regions 164 is also within a range.

For example, in order to eliminate the alternate bright and dark situation of a portion between pixel electrodes 18 and a portion above the pixel electrodes 18 and to eliminate the water ripple phenomenon of the flat display panel, a range of the difference of the thickness of the first regions 162 and the thickness of the second regions 164 is adjusted such that the difference of the electric field strength between pixel electrodes 18 and the electric field strength above the pixel electrodes 18 is maintained in a predetermined range. Furthermore, the difference of the thickness of the first regions 162 and the thickness of the second regions 164 is set such that the difference of the electric field strength between pixel electrodes 18 and the electric field strength above the pixel electrodes 18 is zero. At this time, the portion between pixel electrodes 18 and the portion above the pixel electrodes 18 does not generate the alternate bright and dark situation and the flat display panel does not generate the water ripple phenomenon.

Wherein, the thickness of the first regions 162 and the thickness of the second region 164 are not limited, the only requirement is that the difference of the thickness of the first regions 162 and the thickness of the second regions 164 can achieve maintaining the difference of the electric field strength between the pixel electrodes 18 and the electric field strength above the pixel electrodes 18 in a predetermined range.

Figure 3:
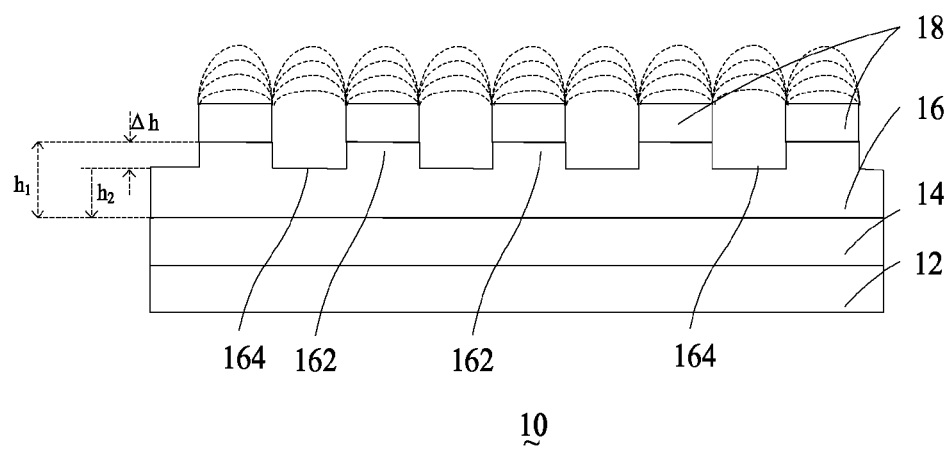
FIG. 3 is an electric field distribution diagram of the flat display panel shown in FIG. 2.

Specifically, with reference to FIG. 3, FIG. 3 is an electric field distribution diagram of the flat display panel shown in FIG. 2. In the insulation layer 16 of the array substrate 100, a thickness of the first regions 162 is h1 and a thickness of the second regions 164 is h2. Wherein, h1>h2, a difference of the thickness of the first regions 162 and the thickness of the second region 164 is Δh.

For the difference of the thickness of the first regions 162 and the thickness of the second region 164 being Δh, on one hand, the difference of the electric field strength between pixel electrodes 18 and the electric field strength above the pixel electrodes 18 is maintained in a predetermined range, and even zero so that an electric field distribution between pixel electrodes 18 and above the pixel electrodes 18 is uniform in order to increase the display effect. On the other hand, the aperture ratio between the pixel electrodes 18 is increased such that a light transmittance between the pixel electrodes 18 is also increased correspondingly. Accordingly, the brightness of the display area between pixel electrodes 18 in increased in order to increase the display brightness of the flat display panel 100.

Of course, in other embodiments, the thickness h1 of the first regions 162 of the insulation layer 16 of the array substrate 100 is smaller than the thickness h2 of the second region 164, that is, h1<h2. Specifically, a material for manufacturing the first regions 162 of the insulation layer 16 and a material for manufacturing the second regions 164 are different. A dielectric constant of the first regions 162 is much greater than a dielectric constant of the second region 164. Because the dielectric constant is inversely proportional to the electric field strength, when the dielectric constant of the first regions 162 is high enough and the dielectric constant of the second regions 164 is low enough, even the thickness h1 of the first regions 162 is smaller than the thickness h2 of the second regions 164, the difference of the electric field strength between pixel electrodes 18 on the insulation layer 16 and the electric field strength above the pixel electrode 18 can also be maintained in a predetermined range.

In flat display panel of the present invention, the insulation layer of the array substrate includes multiple first regions and multiple second regions, wherein, the first regions and the second regions are disposed alternately. Besides, the thickness of the first regions and the thickness of the second regions are different. Then, multiple pixel electrodes are respectively disposed on the first region of the insulation layer. Because the thickness of the first regions and the thickness of the second regions are different, through adjusting the thickness of the first regions and the thickness of the second regions, the electric field strength between pixel electrodes and the electric field strength above the pixel electrode can be adjusted.

According to actual requirement, the difference of the electric field strength between pixel electrodes and the electric field strength above the pixel electrode is maintained in a predetermined range, and even zero such that the brightness between pixel electrodes and the brightness above the pixel electrodes are uniform in order to avoid generating a water ripple phenomenon in a flat display panel so as to increase the display quality and user experience. Besides, the aperture ratio between pixel electrodes is also increased such that the light transmittance is also increased correspondingly in order to increase the brightness between pixel electrodes of the flat display panel. Accordingly, the display brightness of the flat display panel is increased in order to correspondingly decrease the brightness of the backlight plate, save power and save cost.

The present invention also provides an array substrate, and the array substrate is anyone of the array substrates described at above embodiments.

Figure 4:
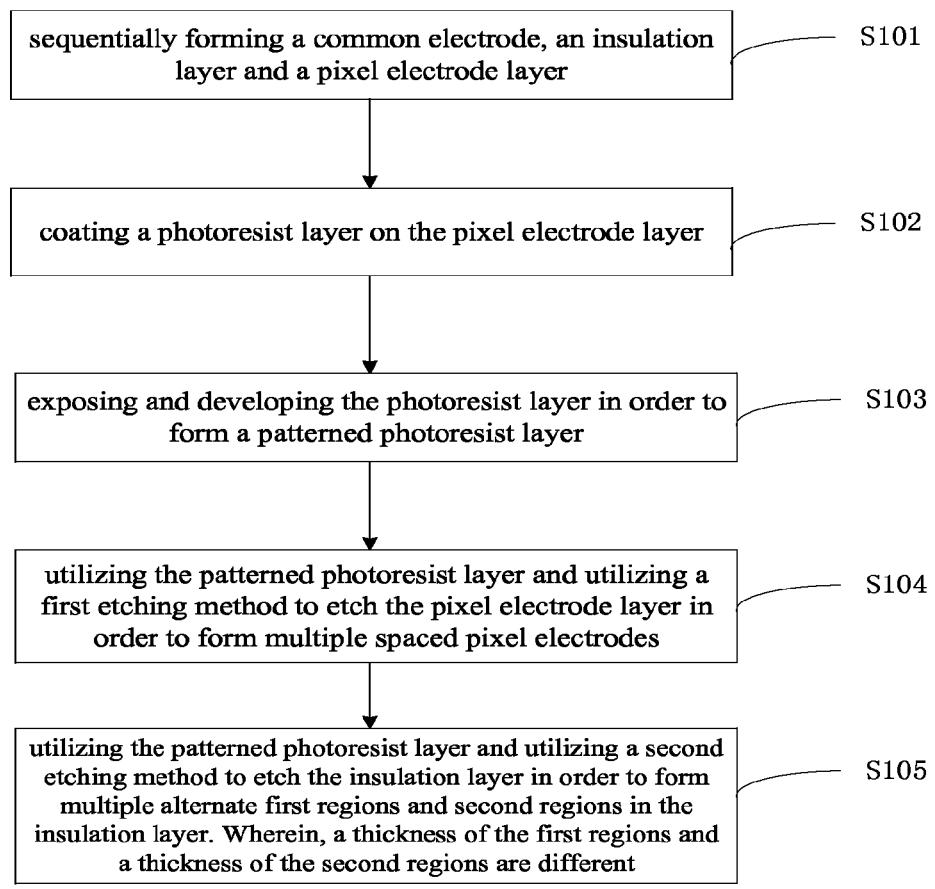
FIG. 4 is a flow chart of a manufacturing method of an array substrate according to an embodiment of the present invention.

Besides, the present invention also provides a manufacturing method for an array substrate. With reference to FIG. 4, FIG. 4 is a flow chart of a manufacturing method of an array substrate according to an embodiment of the present invention. The manufacturing method includes the following steps:

S101: sequentially forming a common electrode, an insulation layer and a pixel electrode layer.

Firstly, forming a substrate;

Then, forming the common electrode on the substrate. The common electrode can be made by a transparent conductive material or other materials which can manufacture conventional common electrodes such as metal materials, etc.

Then, forming an insulation layer on the common electrode, wherein, the materials used for manufacturing the conventional insulation layers of the array substrates are suitable for the insulation layer of the present invention. Besides, the material of the insulation layer can utilize a same material or a material that is mixed by different materials;

Finally, forming the pixel electrode layer on the insulation layer. The pixel electrode layer can be made by a transparent conductive material or other materials that can manufacture the conventional pixel electrodes such as polysilicon, etc.

S102: coating a photoresist layer on the pixel electrode layer.

Wherein, coating photoresist on the pixel electric layer in order to form the photoresist layer. The photoresist can be a conventional photosensitive material such as a positive photoresist or a negative photoresist.

S103: exposing and developing the photoresist layer in order to form a patterned photoresist layer.

Coating developer on the array substrate having the photoresist layer formed in the step S102 in order to dissolve a softened portion of the photoresist layer. Then, processing a development process after exposing under a mask. Finally, the patterned photoresist layer is formed.

S104: utilizing the patterned photoresist layer and utilizing a first etching method to etch the pixel electrode layer in order to form multiple spaced pixel electrodes.

The first etching method is anyone of the etching methods that are used for the conventional liquid crystal devices. For example, the wet etching, the dry etching, the photolithographic etching, the X ray etching, the electric beam etching, or the ion beam etching.

In the present embodiment, the first etching method is the wet etching and utilizing the wet etching to continuously etch the pixel electrode layer below the patterned photoresist layer so that the pixel electrode layer forms multiple spaced pixel electrodes.

S105: utilizing the patterned photoresist layer and utilizing a second etching method to etch the insulation layer in order to form multiple alternate first regions and second regions in the insulation layer. Wherein, a thickness of the first regions and a thickness of the second regions are different.

The second etching method is anyone of the etching methods that are used for the conventional liquid crystal devices. For example, the wet etching, the dry etching, the photolithographic etching, the X ray etching, the electric beam etching, or the ion beam etching.

In the present embodiment, the second etching method is the dry etching and utilizing the dry etching to continuously etch the insulation layer below any two of the pixel electrodes such that the insulation layer forms the multiple alternate first regions and second regions. Wherein, a thickness of the first regions and a thickness of the second regions are different.

The manufacturing method of the present embodiment only requires etching the insulation layer using the second etching method after using a first etching method to etch the pixel electrode layer in order to form the multiple spaced pixel electrodes in the conventional art. Accordingly, the insulation layer can form multiple alternate first regions and second regions having different thicknesses. The manufacturing method can adjust the thickness of the first regions and the thickness of the second regions of the insulation layer in order to adjust the electric field strength between pixel electrodes and the electric field strength above the pixel electrodes, which is simple, quick and can be widely applied.

Furthermore, in another embodiment, in step S105, the manufacturing method further includes a step of utilizing a patterned photoresist layer and a second etching method to etch the insulation layer. The thickness of the first regions and the thickness of the second regions are different. Wherein, a difference of the thickness of the first regions and the thickness of the second regions is set such that the electric field strength between pixel electrodes and the electric field strength above pixel electrodes is maintained in a predetermined range. The predetermined range means that according to an actual requirement, the difference of the electric field strength between pixel electrodes and the electric field strength above the pixel electrodes is in a controllable electric field strength range. In a predetermined range of the electric field strength range, a difference of the thickness of the first regions and the thickness of the second regions is also within a range. For example, in order to eliminate the alternate bright and dark situation of a portion between pixel electrodes and a portion above the pixel electrodes and to eliminate the water ripple phenomenon of the flat display panel, a range of the difference of the thickness of the first regions and the thickness of the second regions is adjusted such that the difference of the electric field strength between pixel electrodes and the electric field strength above the pixel electrodes is maintained in a predetermined range Furthermore, when using the second etching method to etch the insulation layer, the manufacturing method further includes a step of controlling speed and time of the second etching method in order to ensure that a difference of the thickness of the first regions and the thickness of the second region can be set such that a difference of the electric field strength between pixel electrodes and the electric field strength above the pixel electrodes is in a predetermined range.

Furthermore, in another embodiment, in step S105, the manufacturing method further includes a step of setting the difference of the electric field strength between pixel electrodes and the electric field strength above the pixel electrodes to be zero. At this time, the portion between pixel electrodes and the portion above the pixel electrodes does not generate the alternate bright and dark situation and the flat display panel does not generate the water ripple phenomenon.

In the present invention, after using the second etching method to etch the insulation layer, the thickness of the first regions and the thickness of the second region are not limited, the only requirement is that the difference of the thickness of the first regions and the thickness of the second regions can achieve maintaining the difference of the electric field strength between the pixel electrodes and the electric field strength above the pixel electrodes in a predetermined range. For example, after using the second etching method to etch the insulation layer, the thickness of the first regions is greater than the thickness of the second region, or the thickness of the first regions is smaller than the thickness of the second region.

In the present invention, after the step S105, the manufacturing method further includes a step of removing the photoresist layer.

The manufacturing method of the present embodiment only requires etching the insulation layer using the second etching method after using a first etching method to etch the pixel electrode layer in order to form the multiple spaced pixel electrodes in the conventional art. Accordingly, the insulation layer can form multiple alternate first regions and second regions having different thicknesses. The manufacturing method can adjust the thickness of the first regions and the thickness of the second regions of the insulation layer in order to adjust the electric field strength between pixel electrodes and the electric field strength above the pixel electrodes.

According to actual requirement, through the second etching method, the difference of the electric field strength between pixel electrodes and the electric field strength above the pixel electrode is maintained in a predetermined range, and even zero such that the brightness between pixel electrodes and the brightness above the pixel electrodes are uniform in order to avoid generating a water ripple phenomenon in a flat display panel so as to increase the display quality and user experience. The manufacturing method of the array substrate of the present invention is simple, quick and can be widely applied in the industry production.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. An array substrate, comprising:
   a substrate;
   a common electrode disposed on the substrate;
   an insulation layer disposed on the common electrode, wherein, the insulation layer includes multiple first regions and multiple second regions, and the first regions and the second regions are disposed alternately; and
   multiple pixel electrodes respectively disposed on the first regions of the insulation layer;
   wherein, a thickness of the first regions and a thickness of the second regions are different; and
   wherein, a bottom of the first region and a bottom of the second region are coplanar, and a top of the second region is higher than the bottom of the first region.

2. The array substrate according to claim 1, wherein, the thickness of the first regions is greater than the thickness of the second regions.

3. The array substrate according to claim 2, wherein, a difference of the thickness of the first regions and the thickness of the second regions is set to maintain a difference of an electric field strength between pixel electrodes and an electric field strength above the pixel electrodes in a predetermined range.

4. The array substrate according to claim 3, wherein, a difference of the thickness of the first regions and the thickness of the second regions is set to make a difference of an electric field strength between pixel electrodes and an electric field strength above the pixel electrodes be zero.

5. The array substrate according to claim 1, wherein, the common electrode and the pixel electrodes are made by a transparent and conductive material.

6. A flat display panel, comprising:
   a color filter substrate;
   an array substrate disposed oppositely to the color filter substrate; and
   a liquid crystal layer disposed between the color filter substrate and the array substrate;
   wherein, the array substrate includes:
      a substrate;
      a common electrode disposed on the substrate;
      an insulation layer disposed on the common electrode, wherein, the insulation layer includes multiple first regions and multiple second regions, and the first regions and the second regions are disposed alternately; and
      multiple pixel electrodes respectively disposed on the first regions of the insulation layer;
      wherein, a thickness of the first regions and a thickness of the second regions are different; and
      wherein, a bottom of the first region and a bottom of the second region are coplanar, and a top of the second region is higher than the bottom of the first region.

7. The flat display panel according to claim 6, wherein, the thickness of the first regions is greater than the thickness of the second regions.

8. The flat display panel according to claim 7, wherein, a difference of the thickness of the first regions and the thickness of the second regions is set to maintain a difference of an electric field strength between pixel electrodes and an electric field strength above the pixel electrodes in a predetermined range.

9. A manufacturing method for an array substrate, comprising:
- sequentially forming a common electrode, an insulation layer and pixel electrode layer on a substrate;
- coating a photoresist layer on the pixel electrode layer;
- exposing and developing the photoresist layer in order to form a patterned photoresist layer;
- utilizing the patterned photoresist layer and a first etching method to etch the pixel electrode layer in order to form multiple spaced pixel electrodes; and
- utilizing the patterned photoresist layer and a second etching method to etch the insulation layer such that the insulation layer forms multiple alternate first regions and second regions, wherein, a thickness of the first regions and a thickness of the second regions are different;
- wherein, a bottom of the first region and a bottom of the second region are coplanar, and a top of the second region is higher than the bottom of the first region.

10. The manufacturing method for the array substrate according to claim 9, wherein, the first etching method is a wet etching, and the second etching method is a dry etching.

* * * * *